United States Patent
Kim et al.

(10) Patent No.: US 8,481,426 B2
(45) Date of Patent: Jul. 9, 2013

(54) METHOD OF FORMING PATTERN STRUCTURE AND METHOD OF FABRICATING SEMICONDUCTOR DEVICE USING THE SAME

(75) Inventors: Jung-In Kim, Namhyeon-dong (KR); Jaehee Oh, Hwasung (KR); Kiseok Suh, Hwasung (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 13/029,449

(22) Filed: Feb. 17, 2011

(65) Prior Publication Data

US 2011/0207285 A1    Aug. 25, 2011

(30) Foreign Application Priority Data

Feb. 19, 2010  (KR) .................. 10-2010-0015302

(51) Int. Cl.
*H01L 21/44* (2006.01)
*H01L 21/461* (2006.01)
*H01L 21/302* (2006.01)
*H01L 21/311* (2006.01)
*H01L 21/469* (2006.01)

(52) U.S. Cl.
USPC ........... 438/671; 438/736; 438/737; 438/738; 257/E21.005; 257/E21.023; 257/E21.024; 257/E21.017; 257/E21.02

(58) Field of Classification Search
USPC .................. 257/E21.005, E21.023, E21.024, 257/E21.017, E21.02, E21.305, E21.582, 257/E21.595
See application file for complete search history.

(56) References Cited

U.S. PATENT DOCUMENTS

| 7,524,752 | B2  |  4/2009 | Tsutsue |
| 7,615,497 | B2* | 11/2009 | Bok et al. ...................... 438/736 |
| 2007/0148968 | A1* | 6/2007 | Kwon et al. .................. 438/671 |
| 2007/0275560 | A1  | 11/2007 | Nishimura et al. |
| 2008/0096391 | A1* | 4/2008 | Kwon et al. .................. 438/702 |
| 2008/0198649 | A1* | 8/2008 | Park ............................. 365/174 |
| 2008/0318411 | A1  | 12/2008 | Tsutsue |

FOREIGN PATENT DOCUMENTS

| JP | 2007-227529 A | 9/2007 |
| JP | 2009004665 A  | 1/2009 |
| KR | 2009-0011105  | 2/2009 |

* cited by examiner

*Primary Examiner* — Mohsen Ahmadi
(74) *Attorney, Agent, or Firm* — Harness, Dickey & Pierce, P.L.C.

(57) ABSTRACT

A method of forming a pattern structure and a method of fabricating a semiconductor device using the pattern structure, are provided the method of forming the pattern structure includes forming a mask on an underlying layer formed on a lower layer. The underlying layer is etched using the mask as an etching mask, thereby forming patterns on the lower layer. The patterns define at least one opening. A sacrificial layer is formed in the opening and the mask is removed. The sacrificial layer in the opening is partially etched when the mask is removed.

18 Claims, 10 Drawing Sheets

METHOD OF FORMING PATTERN STRUCTURE AND METHOD OF FABRICATING SEMICONDUCTOR DEVICE USING THE SAME

CROSS-REFERENCE TO RELATED APPLICATIONS

This U.S. non-provisional patent application claims priority under 35 U.S.C. §119 of Korean Patent Application No. 10-2010-0015302, filed on Feb. 19, 2010, the entire contents of which are hereby incorporated by reference.

BACKGROUND

1. Field

The present disclosure herein relates to a method of forming a semiconductor device, and more particularly, to a method of forming a pattern structure and a method of fabricating a semiconductor device using the same.

2. Related Art

In order to fabricate a semiconductor device, it is necessary to form desired patterns using a mask. A photoresist pattern is widely used as the mask. Recently, various kinds of material layers are used as the mask to form fine patterns. The mask may include nitride or oxide according to the material of an underlying layer to be etched in a subsequent process. The mask is removed after formation of the patterns. A substrate or a lower structure exposed by the patterns may be damaged when the mask including the nitride or the oxide is removed. The damaged substrate or the damaged lower structure may cause degradation of electrical characteristics of a semiconductor device which is completed through subsequent processes.

SUMMARY

The present disclosure is directed to a method of forming a pattern structure.

The present disclosure is also directed to a method of fabricating a semiconductor device.

Example embodiments of the inventive concepts provide a method of forming a pattern structure. In example embodiments, the method includes forming a mask on an underlying layer formed on a lower layer. The underlying layer is etched using the mask as an etching mask to form patterns. The patterns define at least one opening. A sacrificial layer is formed in the opening. The sacrificial layer covers the lower layer below the opening. The mask is then removed. The sacrificial layer in the opening is partially etched when the mask is removed.

In some example embodiments, the sacrificial layer may be formed of an organic material.

In other embodiments, the sacrificial layer may include any one of a silicon layer containing hydrogen and carbon, a silicon layer containing carbon, a photoresist layer, a polymer layer, and a combination thereof.

In still other example embodiments, the method may further include removing the sacrificial layer in the opening after removal of the mask. The sacrificial layer may be removed using an ashing or strip process.

In even other example embodiments, the mask may contain silicon or nitride.

In yet other embodiments, the lower layer may be protected by the sacrificial layer when the mask is removed.

In further example embodiments, the mask may be removed using an etch back process.

In still further example embodiments, the sacrificial layer may be formed to cover the mask.

In even further example embodiments, the method may further include etching an upper portion of the sacrificial layer to expose an upper surface of the mask, after the sacrificial layer is formed. Etching the upper portion of the sacrificial layer and removing the mask may be performed using the same process condition. Removing the mask may be continuously performed after the upper portion of the sacrificial layer is etched.

Example embodiments of the inventive concepts also provide a method of fabricating a semiconductor device. In example embodiments, the method includes forming a mask on an insulating layer formed on a substrate. The insulating layer is etched using the mask as an etching mask to form insulating patterns on the substrate. The insulating patterns define at least one opening which exposes a portion of the substrate. A sacrificial layer is formed in the opening to cover the exposed substrate. The mask is then removed. The sacrificial layer in the opening is removed. A selection element is formed in the opening. A lower electrode, a variable resistance pattern, and an upper electrode are formed on the substrate including the upper electrode. The lower electrode, the variable resistance pattern and the upper electrode are electrically connected to the selection element. The sacrificial layer in the opening is partially etched when the mask is removed.

In some example embodiments, the sacrificial layer may be formed of an organic material. The organic material may include one of a silicon layer containing hydrogen and carbon, a silicon layer containing carbon, a photoresist layer, a polymer layer, and a combination thereof.

In other example embodiments, the mask may be removed using an etch back process, and the substrate may be protected by the sacrificial layer when the mask is removed.

In still other example embodiments, the variable resistance pattern may include a chalcogenide material. The variable resistance pattern may include at least one selected from the group consisted of SeSbTe, GeTeAs, SnTeSn, GeTe, SbTe, SeTeSn, GeTeSe, SbSeBi, GeBiTe, GeTeTi, InSe, GaTeSe, and InSbTe.

In even other example embodiments, the variable resistance pattern may further include at least one selected from the group consisted of carbon (C), nitrogen (N), silicon (Si), and oxygen (O).

In yet other example embodiments, the method may further include forming an ohmic layer between the selection element and the lower electrode.

In further example embodiments, the method may further include forming a word line between the substrate and the selection element.

In still further example embodiments, the method may further include forming a bit line electrically connected to the upper electrode. The bit line may extend in a direction substantially different from that of the word line.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concepts and, together with the description, serve to explain principles of the inventive concept. In the drawings.

DETAILED DESCRIPTION OF THE EMBODIMENTS

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described. Hereinafter, example embodiments of the inventive concepts will be described in detail with reference to the drawings.

The present disclosure herein relates to a method of forming a semiconductor device, and more particularly, to a method of forming a pattern structure and a method of fabricating a semiconductor device using the same.

(Method of Forming Pattern Structure)

FIGS. 1A through 1G are cross-sectional views illustrating a method of forming a pattern structure according to example embodiments of the inventive concepts.

Figure 1A:
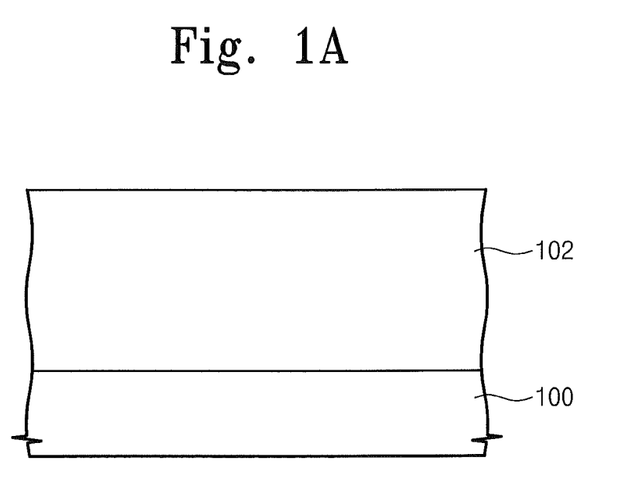
FIGS. 1A through 1G are cross-sectional views illustrating a method of forming a pattern structure according to example embodiments of the inventive concepts.

Referring to FIG. 1A, an underlying layer 102 is formed on a lower layer 100.

The lower layer 100 may serve as a substrate. For example, the substrate may include a semiconductor substrate such as a silicon (Si) substrate, a germanium (Ge) substrate, a silicon-germanium (Si—Ge) substrate, a silicon-on-insulator (SOI) substrate, or a germanium-on-insulator (GOI) substrate.

According to some example embodiments of the inventive concepts, the underlying layer 102 may be formed of oxide, nitride, or oxynitride. The oxide may include silicon oxide and the nitride may include silicon nitride. In addition, the oxynitride may include silicon oxynitride. The silicon oxide may include at least one of BoroSilicate Glass (BSG), PhosphoSilicate Glass (PSG), BoroPhosphoSilicate Glass (BPSG), Plasma Enhanced TetraEthylOrthoSilicate (PE-TEOS), and high density plasma (HDP) oxide.

The underlying layer 102 may be formed using a chemical vapor deposition (CVD) technique, a low pressure CVD (LPCVD) technique, or a plasma enhanced CVD (PECVD) technique.

According to other example embodiments of the inventive concepts, a lower structure (not shown) may be further formed, prior to formation of the underlying layer 102. The lower structure may include an impurity region, a pad, a plug, a contact, a conductive layer pattern, or an insulating layer pattern. In this case, the underlying layer 102 may be formed on the lower layer 100 so as to cover the lower structure.

Figure 1B:
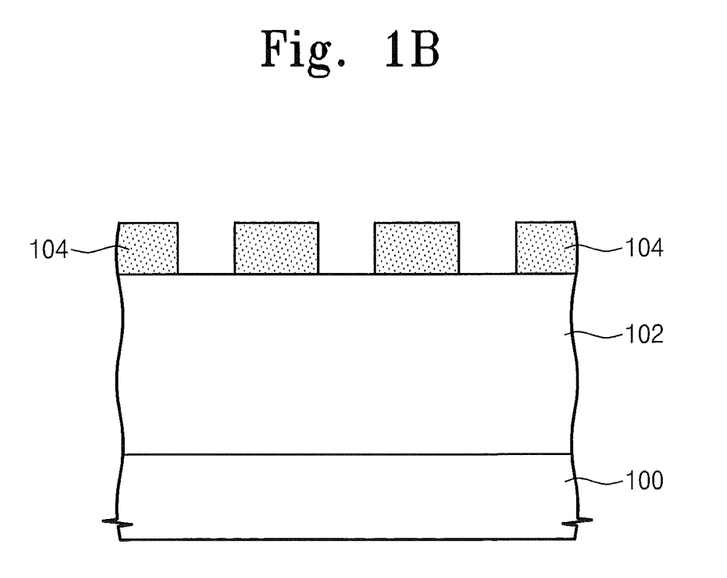

Referring to FIG. 1B, a mask 104 may be formed on the underlying layer 102. More specifically, a mask layer (not shown) and a photoresist pattern (not shown) may be sequentially formed on the underlying layer 102. The mask layer may be etched using the photoresist pattern as an etching mask, thereby forming the mask 104. The photoresist pattern may be removed by an ashing process or a strip process, after formation of the mask 104.

According to example embodiments of the inventive concepts, the mask 104 may include silicon or nitride. The nitride may include a silicon nitride (SiN) layer.

Figure 1C:
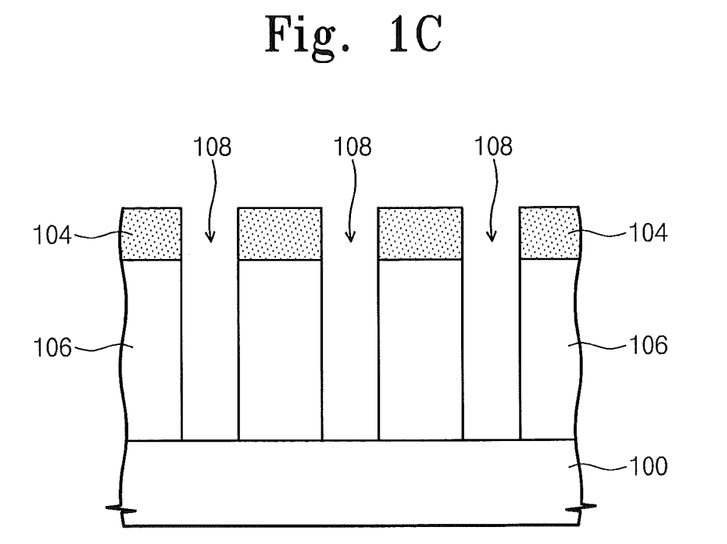

Referring to FIG. 1C, the underlying layer 102 (see FIG. 1B) is etched using the mask 104 to form patterns 106 on the lower layer 100.

More specifically, the underlying layer 102 may be anisotropically etched using the mask 104 as an etching mask, thereby forming openings 108 which penetrate the underlying layer 102. The anisotropic etching may include a plasma etching technique. As a result, the patterns 106 may be formed on the lower layer 100, and the openings 108 may be formed between the patterns 106 to expose portions of the lower layer 100.

Figure 1D:
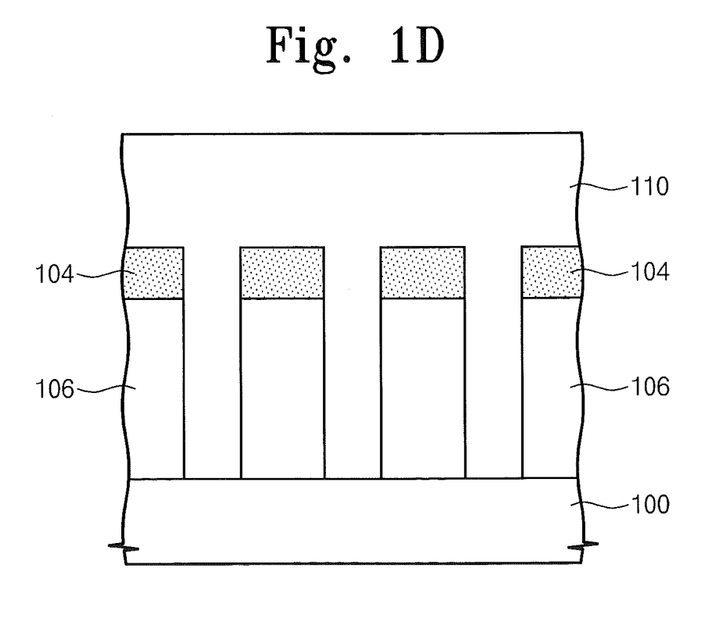

Referring to FIG. 1D, a sacrificial layer 110 may be formed in the openings 108 (see FIG. 1C) and on the mask 104. That is, the sacrificial layer 110 may be formed to fill the openings 108 and to cover a top surface of the mask 104.

The sacrificial layer 110 may be formed using a chemical vapor deposition technique, a low pressure CVD technique, a plasma enhanced CVD technique, or a spin coating technique.

The sacrificial layer 110 may be formed of a material layer having an etching selectivity with respect to the patterns 106.

According to other example embodiments of the inventive concepts, the sacrificial layer 110 may be formed of an organic material. The sacrificial layer 110 may be formed of at least one of silicon organic hybrid (SOH), photoresist, polymer, and combination thereof. The silicon organic hybrid (SOH) may include silicon containing hydrogen and carbon (H-SOC) or silicon containing carbon (C-SOC).

According to example embodiments of the inventive concepts, the sacrificial layer 110 may be formed on the lower layer 100 to cover the mask 104 and to fill the openings 108. The openings 108 may include the spaces that penetrate the mask 104.

According to other example embodiments of the inventive concepts, the sacrificial layer 110 may be formed on the lower layer 100 only to fill the openings 108. In this case, the upper surface of the sacrificial layer 110 may have substantially the same level as the upper surface of the mask 104.

Figure 1E:
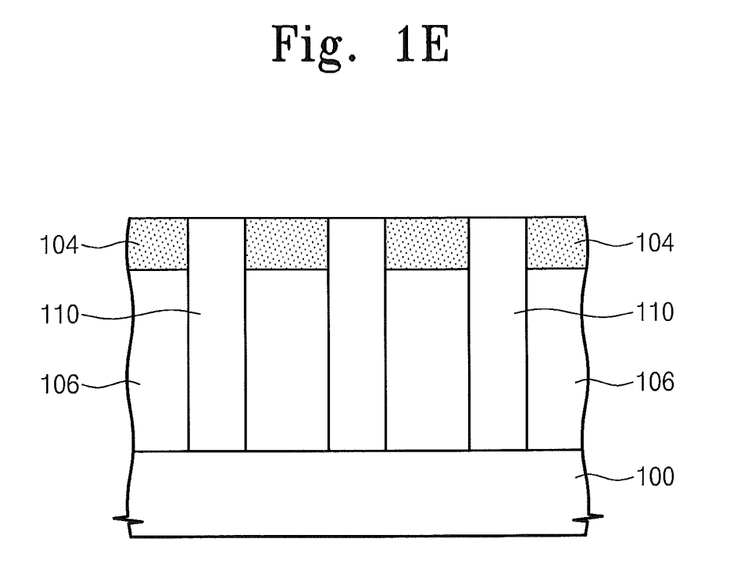

Referring to FIG. 1E, when the sacrificial layer 110 is formed to cover the mask 104, the upper portion of the sacrificial layer 110 may be partially etched to expose the upper surface of the mask 104. The upper portion of the sacrificial layer 110 may be etched using an etch back technique.

After the upper portion of the sacrificial layer 110 is removed by the etch back technique, the upper surface of the etched sacrificial layer 110 may have substantially the same level as the upper surface of the mask 104.

According to other example embodiments of the inventive concepts, the sacrificial layer 110 may be formed only in the openings 108 as mentioned above. In this case, the etch back process for removing the upper portion of the sacrificial layer 110 may not be performed.

Figure 1F:
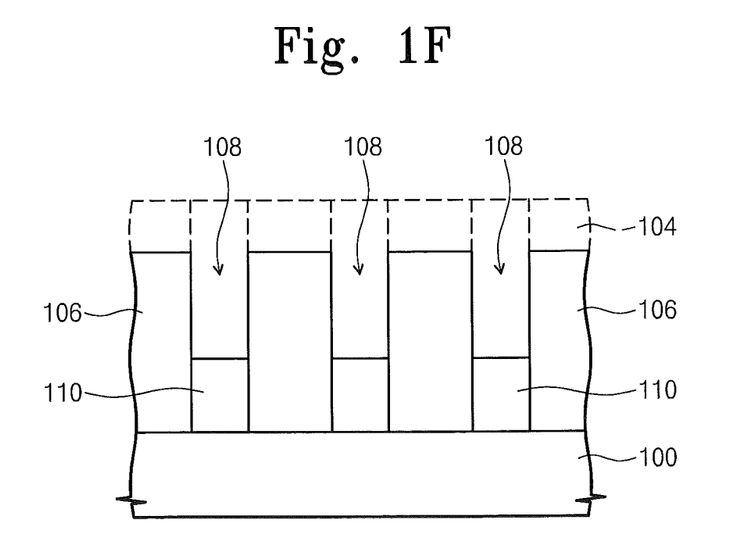

Referring to FIG. 1F, the mask 104 is removed.

According to example embodiments of the inventive concepts, the process condition to remove the mask 104 may be substantially the same as that to partially etch the upper portion of the sacrificial layer 110 described with reference to FIG. 1E. The process to remove the mask 104 may be performed in succession, after the upper portion of the sacrificial layer 110 is partially etched.

During removal of the mask 104, a part of the sacrificial layer 110 in the openings 108 may be etched. That is, the sacrificial layer 110 may be recessed after the mask 104 is removed. However, even though the sacrificial layer 110 is recessed, remaining portions of the sacrificial layer 110 may still exist in the openings 108 to cover the lower layer 100. Accordingly, when the mask 104 is removed, the remaining sacrificial layer 110 may protect the lower layer 100 which is located below the openings 108.

Figure 1G:
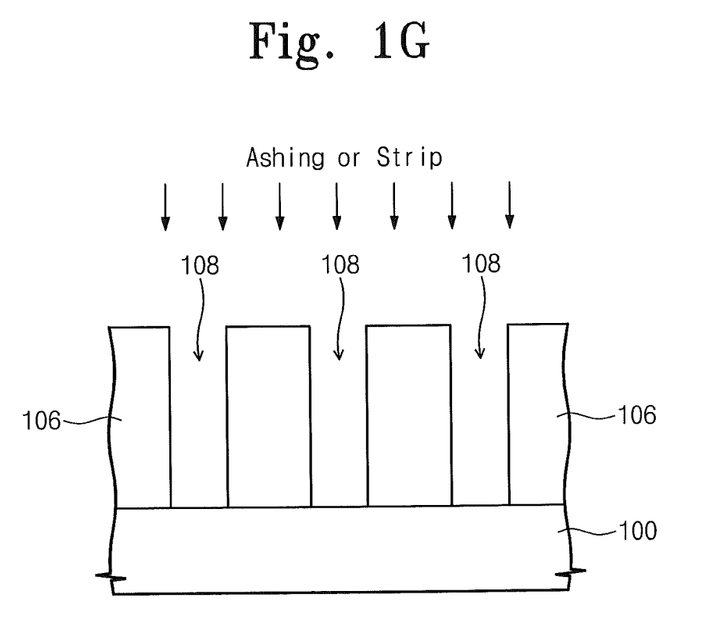

Referring to FIG. 1G, the sacrificial layer 110 remaining in the openings 108 may be removed.

According to example embodiments of the inventive concepts, the sacrificial layer 110 remaining in the openings 108 may be removed using an ashing process or a strip process. By removing the sacrificial layer 110, the lower layer 100 may be exposed by the openings 108 again.

(Method of Fabricating Semiconductor Device)

The method of forming the pattern structure described with reference to FIGS. 1A through 1G is applicable to the formation of a semiconductor device including a memory device and a non-memory device. Now, methods of fabricating a semiconductor device will be described in conjunction with a resistance memory device (also referred to as "a resistance random access memory (RRAM) device").

Figure 2:
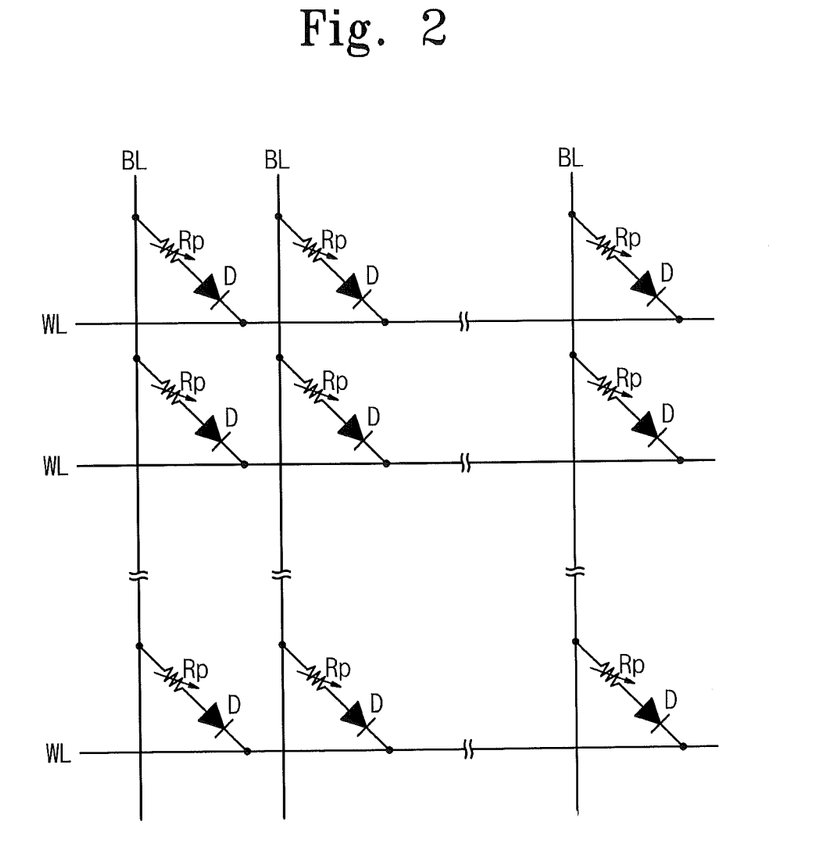
FIG. 2 is a circuit diagram illustrating a cell array of a semiconductor device according to example embodiments of the inventive concepts.

FIG. 2 is a circuit diagram illustrating a memory cell array of a semiconductor device according to example embodiments of the inventive concepts.

Referring to FIG. 2, a plurality of memory cells may be arrayed in a matrix form. Each memory cell may include a variable resistance element $R_P$ and a selection element D. The variable resistance element $R_P$ may be connected to a bit line BL and the selection element D. That is, one terminal of the variable resistance element $R_P$ may be electrically connected to the bit line BL and the other terminal of the variable resistance element $R_P$ may be electrically connected to the selection element D. The selection element D may be connected to the variable resistance element $R_P$ and a word line WL. That is, one terminal of the selection element D may be electrically connected to the variable resistance element $R_P$ and the other terminal of the selection element D may be electrically connected to the word line WL. The variable resistance element $R_P$ may include, for example, a phase-change material, a ferroelectric material, or a magnetic material. The information state of the variable resistance element $R_P$ may be determined according to an amount of the current which flows through the variable resistance element $R_P$ and the bit line BL connected thereto.

The current flowing through the variable resistance element $R_P$ may be controlled in accordance with the voltage applied to the word line WL. In the example embodiments illustrated in FIG. 2, a diode is used as the selection element D. However, the selection element D is not limited to the diode. For example, a MOS transistor or a bipolar transistor may be used as the selection element D.

Hereinafter, a variable resistance memory device will be described, and the variable resistance memory device may include a plurality of memory cells. Each of the memory cells may employ a phase-change material as the variable resistance element R. However, the invention is not limited to the phase-change memory device and is applicable to a resistance random access memory (RRAM), a ferroelectric RAM (FRAM), a magnetic RAM (MRAM).

In example embodiments of the inventive concepts, the electric resistance of the phase-change material, which serves as the variable resistance element $R_P$, may be varied according to a temperature. That is, the phase-change material may have an amorphous state with a relatively high resistance or a crystalline state with a relatively low resistance. If the phase-change material is heated to a temperature over the melting point thereof and is cooled down rapidly, the phase-change material may be transformed into the amorphous state. On the contrary, if the phase-change material is heated to a temperature within the range of the crystallization temperature thereof to the melting point and is cooled down slowly, the phase-change material may be transformed into the crystalline state. The variable resistance element $R_P$ generates the Joule's heat when a current is forced into the phase-change material via a lower electrode, and the phase-change material is heated up. At this time, the Joule's heat may be generated in proportion to the resistivity of the phase-change material and a supply time of current.

Hereinafter, methods of fabricating the semiconductor device illustrated in FIG. 2 will be described.

FIGS. 3A through 3G are cross-sectional views illustrating the methods of fabricating the semiconductor device according to example embodiments of the inventive concepts.

Figure 3A:
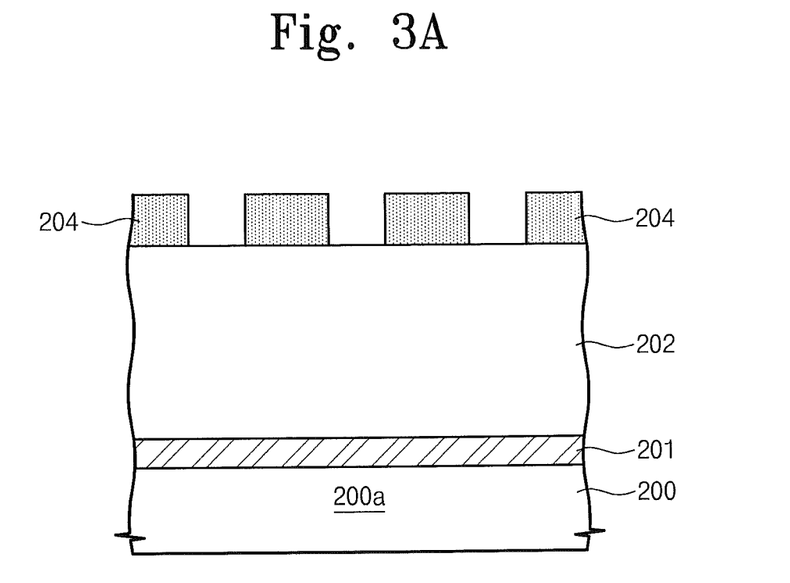
FIGS. 3A through 3F are cross-sectional views illustrating a method of fabricating the semiconductor device according to example embodiments of the inventive concepts.

Referring to FIG. 3A, a word line 201, an insulating layer 202, and a first mask 204 may be sequentially formed on the substrate 200.

More specifically, the substrate 200 may be a substrate doped with first impurities. For example, the substrate 200 may be a substrate doped with p-type impurities. The p-type impurities may include boron (B), gallium (Ga), or indium (In).

Even though not shown in the drawings, a device isolation layer may be formed in the substrate 200. The device isolation layer acts as a field region. The device isolation layer may be formed using a shallow trench isolation (STI) process. The device isolation layer defines at least one active area 200a in the substrate 200. The active area 200a may extend in a first direction.

The word line 201 may be formed on the substrate 200 after formation of the device isolation layer. The word line 201 may be formed using an ion-implantation technique. That is, second impurities may be implanted into the active area 200a, thereby forming the word line 201. When the substrate 200 is a p-type silicon substrate, the second impurities may be n-type impurities. The n-type impurities may include phosphorus (P), arsenic (As), or antimony (Sb).

Alternatively, the word line 201 may be formed using an epitaxial technique. That is, the word line 201 may be formed by growing an epitaxial semiconductor layer on the substrate 200 and then implanting the second impurities into the epitaxial semiconductor layer. In other example embodiments, the word line 201 may be formed of a metal layer or a metal compound layer.

The word line 201 may be formed to extend in the first direction. That is, the word line 201 may be formed to be parallel with the active area 200a. The word line 201 may include a plurality of conductive lines. The plurality of word lines 201 may be separated from each other and parallel to each other.

The insulating layer 202 may be formed on the substrate 200 including the word lines 201.

The insulating layer 202 may include at least one of oxide, nitride, and oxynitride. The oxide may be a silicon oxide layer, and the nitride may be a silicon nitride layer. In addition, the oxynitride may be a silicon oxynitride layer. The silicon oxide layer may include at least one of a BSG layer, a PSG layer, a BPSG layer, a PE-TEOS layer, and an HDP oxide layer. The insulating layer 202 may be formed using a chemical vapor deposition (CVD) technique. In more detail, the insulating layer 202 may be formed using a low pressure CVD technique, or a plasma enhanced CVD technique.

The first mask 204 is formed on the insulating layer 202. The first mask 204 may include silicon or nitride. The nitride may be a silicon nitride layer.

Figure 3B:
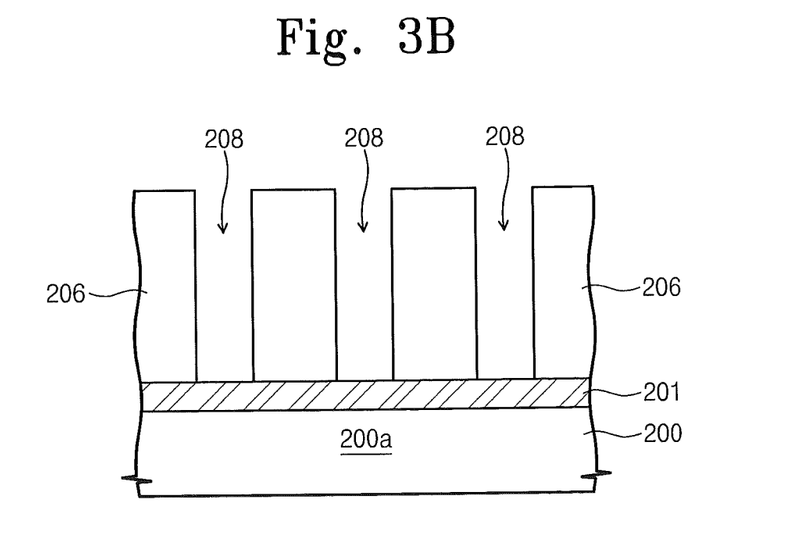

Referring to FIG. 3B, the insulating layer 202 (see FIG. 3A) may be etched using the first mask 204 as an etching mask, thereby forming insulating patterns 206 on the substrate 200. The insulating patterns 206 define openings 208 which expose set portions of the word line 201.

The process of forming the insulating patterns 206 on the substrate 200 is substantially the same as the process of forming the patterns 106 on the substrate 100 described with reference to FIGS. 1A through 1G. Further, the first mask 204 may be removed using the same process as the example embodiments illustrated in FIGS. 1A through 1G. That is, when the first mask 204 is removed, the exposed portions of the word line 201 may be protected by a sacrificial layer (not shown). Thus, the detailed description of the process of forming the insulating patterns 206 and removing the first mask 204 will be omitted.

Figure 3C:
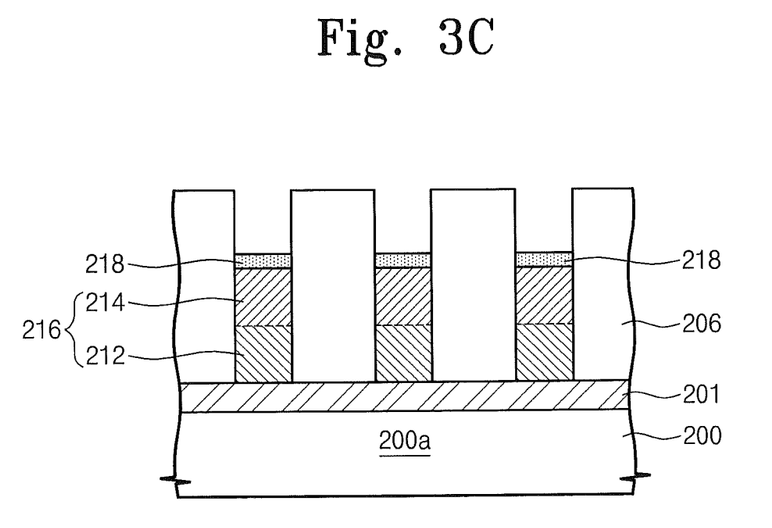

Referring to FIG. 3C, a selection element 216 and an ohmic layer 218 are formed in each of the openings 208.

According to example embodiments of the inventive concepts, a diode may be used as the selection element 216. The process of forming the diode will be described in more detail. A second conductive layer (not shown) is formed on the exposed portions of the word line 201. The second conductive layer may be formed using a selective epitaxial growth (SEG) process in which the word line 201 exposed by the openings 208 is used as a seed. At this time, the second conductive layer may be formed so as not to completely fill the openings 208. Third impurities and fourth impurities are implanted into the second conductive layer to form a lower layer 212 doped with the third impurities and an upper layer 214 doped with the fourth impurities. When the substrate 200 is a P-type silicon substrate and the word line 201 is doped with N-type impurities, the third impurities may be P-type impurities and the fourth impurities may be N-type impurities. That is, the lower layer 212 and the upper layer 214 are doped with the P-type impurities and the N-type impurities, respectively. Therefore, the lower layer 212 and the upper layer 214 constitute the diode which is used as the selection element 216.

The ohmic layers 218 may be formed on the selection elements 216.

The ohmic layers 218 may be formed by applying a silicidation process to the substrate having the diode. Accordingly, each of the ohmic layers 218 may include a metal silicide layer. For example, the metal silicide layer may include at least one of a titanium silicide (TiSi) layer, a cobalt silicide (CoSi) layer, a tantalum silicide (TaSi) layer, and a tungsten silicide (WSi) layer.

The ohmic layers 218 may be formed so as not to completely fill the openings 208. That is, even after the ohmic layers 218 are formed, top surfaces of the ohmic layers 218 may be lower than the top surfaces of the insulating patterns 206.

Figure 3D:
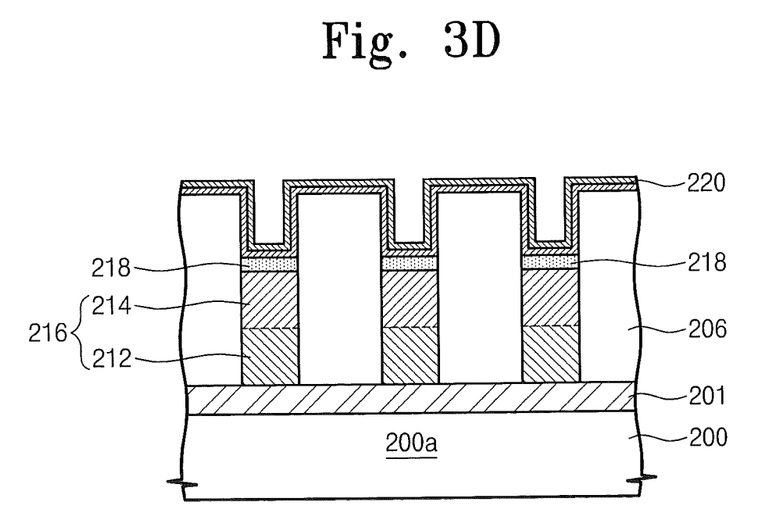

Referring to FIG. 3D, a lower electrode layer 220 is conformally formed on the ohmic layers 218 and the insulating patterns 206.

The lower electrode layer 220 may be formed continuously along the surface profile of the insulating patterns 206 and the ohmic layers 218 so as not to fill the openings 208.

The lower electrode layer 220 may have a single layered structure including a metal layer or a multi-layered structure including a metal layer and a metal nitride layer. The metal layer may be formed of at least one of tungsten (W), titanium (Ti), tantalum (Ta), aluminum (Al), molybdenum (Mo), niobium (Nb), and zirconium (Zr). The metal nitride layer may be formed of at least one of tungsten nitride (WN), titanium nitride (TiN), tantalum nitride (TaN), aluminum nitride (AlN), molybdenum nitride (MoN), niobium nitride (NbN), zirconium nitride (ZrN), titanium aluminum nitride (TiAlN), tantalum aluminum nitride (TaAlN), and zirconium aluminum nitride (ZrAlN).

Figure 3E:
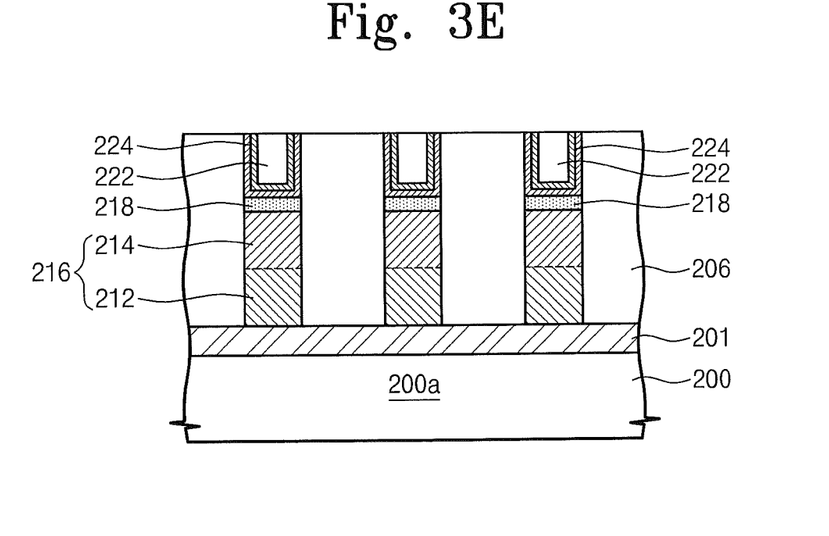

Referring to FIG. 3E, a lower electrode 224 and a filling pattern 222 are formed on each of the ohmic layers 218. The lower electrode 224 may be formed to surround a bottom surface and a sidewall of the filling pattern 222.

More specifically, a filling layer (not shown) may be formed on the lower electrode layer 220 to completely fill the openings 208. The filling layer may be formed of an insulating material. For example, the filling layer may be formed of at least one of an oxide layer, a nitride layer, and an oxynitride layer.

The upper portions of the filling layer and the lower electrode layer 220 may be etched to expose the top surfaces of the insulating patterns 206. As a result, the lower electrode 224 and the filling pattern 222 may be formed in each opening 208. Each of the lower electrodes 224 may be formed to surround a bottom surface and a sidewall of each of the filling patterns 222. The filling layer and the lower electrode layer 220 may be etched using a chemical mechanical polishing (CMP) technique or an etch back technique.

The lower electrodes 224 have a stereoscopic structure such as a hollow polygonal pillar structure, a hollow cylindrical structure or a cup-shaped structure. That is, each of the lower electrodes 224 may have a U-shaped vertical cross-section. The lower width of the lower electrode 224 may be substantially the same as the width of the ohmic layer 218.

Alternatively, each of the lower electrodes 224 may have a laminate structure. In this case, the filling patterns 222 may not be formed.

Figure 3F:
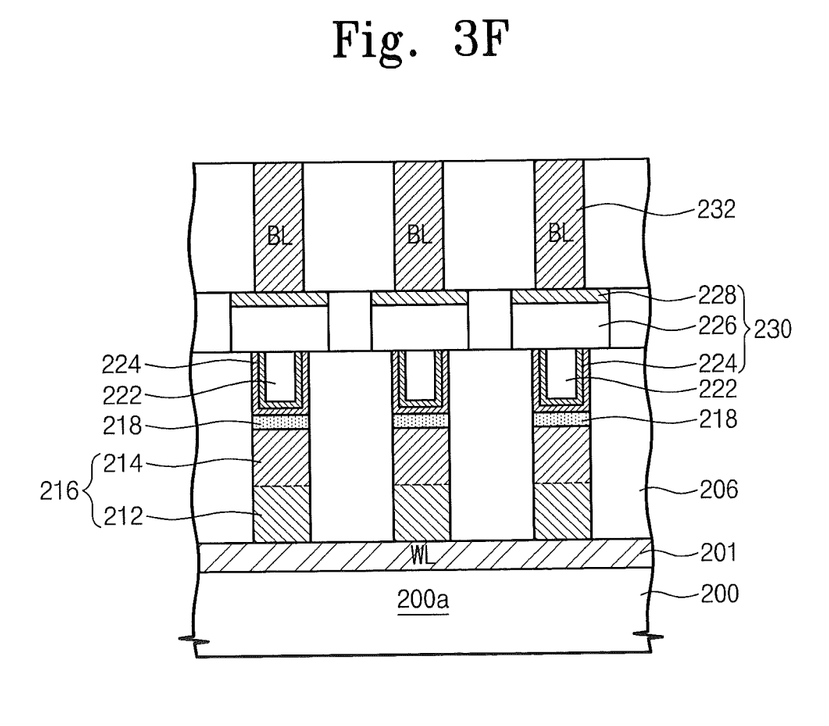

Referring to FIG. 3F, variable resistance patterns 226, upper electrodes 228, and bit lines 232 may be formed on the substrate including the lower electrodes 224. The variable resistance patterns 226, upper electrodes 228, and bit lines 232 are electrically connected to the lower electrodes 224.

More specifically, a variable resistance layer (not shown) and an upper electrode layer (not shown) are sequentially stacked or laminated on the substrate including the lower electrodes 224, the filling patterns 222, and the insulating patterns 206.

The variable resistance layer may include a phase-change material such as a chalcogenide material. The variable resistance layer may be formed of SeSbTe, GeTeAs, SnTeSn, GeTe, SbTe, SeTeSn, GeTeSe, SbSeBi, GeBiTe, GeTeTi, InSe, GaTeSe, or InSbTe. According to other example embodiments of the inventive concepts, the variable resistance layer may further include a phase-change material doped with carbon, nitrogen, silicon, oxygen, or the like.

The upper electrode layer may have a single layered structure including a metal layer or a multi-layered structure including a metal layer and a metal nitride layer. The metal layer may be formed of at least one of tungsten (W), titanium (Ti), tantalum (Ta), aluminum (Al), molybdenum (Mo), niobium (Nb), zirconium (Zr), nickel (Ni), ruthenium (Ru), palladium (Pd), hafnium (Hf), iridium (Ir), and platinum (Pt). The metal nitride layer may be formed of at least one of tungsten nitride (WN), titanium nitride (TiN), tantalum nitride (TaN), aluminum nitride (AN), molybdenum nitride (MoN), niobium nitride (NbN), zirconium nitride (ZrN), ruthenium nitride (RuN), hafnium nitride (HfN), iridium nitride (IrN), platinum nitride (PtN), titanium aluminum nitride (TiAlN), tantalum aluminum nitride (TaAlN), and zirconium aluminum nitride (ZrAlN).

A second mask (not shown) is formed on the upper electrode layer. The upper electrode layer and the variable resistance layer may be sequentially etched using the second mask as an etching mask to form the upper electrodes 228 and the variable resistance patterns 226, respectively.

The second mask may be removed after formation of the upper electrodes 228 and the variable resistance patterns 226. The second mask may be removed using an ashing process or a strip process.

Accordingly, the variable resistance elements 230 ($R_P$) may be formed on the selection elements 216, respectively. Each of the variable resistance elements 230 may include the lower electrode 224, the variable resistance pattern 226, and the upper electrode 228 which are sequentially stacked.

The bit lines 232 are formed on the substrate including the upper electrodes 228. The bit lines 232 may be electrically connected to the upper electrodes 228. The bit lines 232 may extend in a second direction. The second direction may be substantially different from the first direction. For example, the second direction may be perpendicular to the first direction.

(Applied Examples)

The pattern structure formed according to example embodiments of the inventive concepts is applicable to a semiconductor memory device or a non-memory device. In this applied example, a memory device including the pattern structure formed according to example embodiments of the inventive concepts will be described as an example.

Figure 4A:
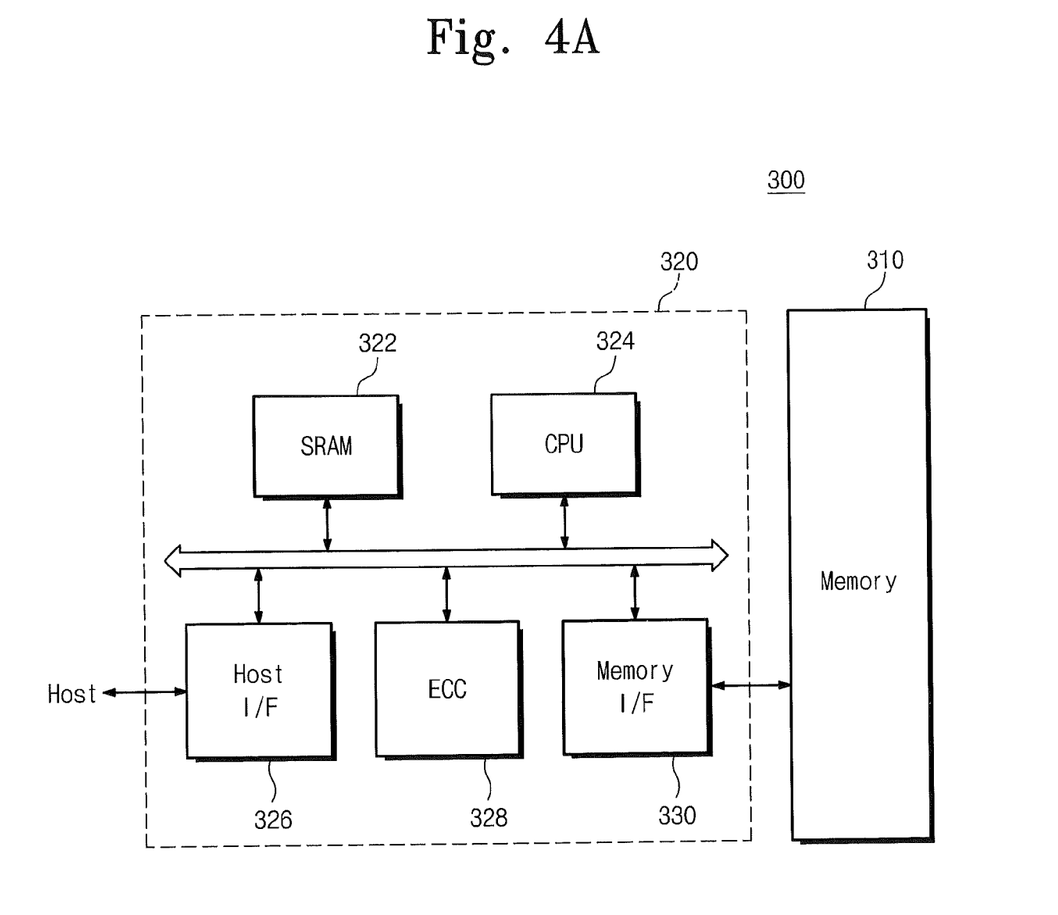
FIG. 4A is a block diagram to illustrate a system including the semiconductor device according to example embodiments of the inventive concepts.

FIG. 4A is a block diagram illustrating a memory card including the semiconductor device according to example embodiments of the inventive concepts.

Referring to FIG. 4A, the semiconductor device includes the pattern structure according to example embodiments of the inventive concepts. The semiconductor device is applicable to a memory card 300. For example, the memory card 300 may include a memory controller 320 which controls data communication between a host and a memory 310. A static random access memory (SRAM) 322 may be used as a memory device of a central processing unit 324. A host interface 326 may have a data exchange protocol of the host connected to the memory card 300. An error correction code 328 may detect and correct errors contained in data read from the memory 310. A memory interface 330 communicates with the memory 310. The memory 310 may include a resistance memory device. The central processing unit 324 controls all the operations of the memory controller 320.

The memory 310 employed in the memory card 300 is formed by the method of forming the semiconductor memory device according to example embodiments of the inventive concepts. Therefore, it can prevent the lower structure (e.g., the word lines 201) from being damaged during removal of the mask (e.g., the first mask 204). Accordingly, it is possible to improve the electrical characteristics of the memory 310.

Figure 4B:
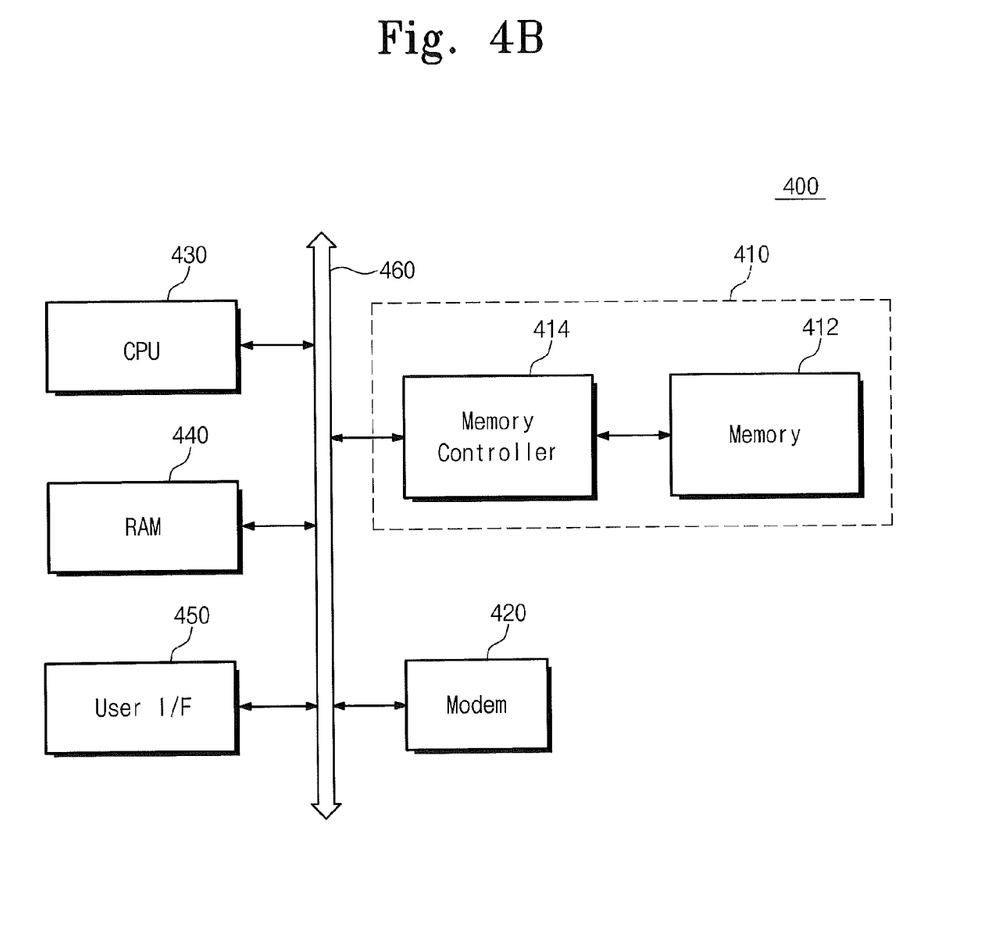
FIG. 4B is a block diagram to illustrate a memory card including the semiconductor device according to example embodiments of the inventive concepts.

FIG. 4B is a block diagram illustrating an information processing system to which the semiconductor device according to example embodiments of the inventive concepts is applied.

Referring to FIG. 4B, an information processing system 400 may include a memory system 410 with the semiconductor memory device, such as the resistance-variable memory, according to example embodiments of the inventive concepts. The information processing system 400 may include a mobile device or a computer. For example, the information processing system 400 may include the memory system 410, a modem 420, a central processing unit 430, a RAM 440, and a user interface 450 electrically connected to a system bus 460. The memory system 410 may store data processed by the central processing unit 430 or data input from the outside. The memory system 410 may include a memory 412 or a memory controller 414. The memory system 410 may have substantially the same configuration as that of the memory card 300 described with reference to FIG. 4A. The information processing system 400 may be provided as a memory card, a solid state disk, a camera image sensor, and other application chipsets. For example, the memory system 410 may be configured by a solid state disk (SSD). In this case, the information processing system 400 may store large data stably and reliably.

According to example embodiments of the inventive concepts, because the lower layer is protected by the sacrificial layer when the mask is removed, it is possible to prevent the damage of the lower layer. Accordingly, it is possible to prevent the defects of the semiconductor device occurring due to the damage of the lower layer.

Although the present invention has been described in connection with the example embodiments illustrated in the accompanying drawings, it is not limited thereto. It will be apparent to those skilled in the art that various substitution, modifications and changes may be thereto without departing from the scope and spirit of the invention.

What is claimed is:

1. A method of forming a pattern structure, comprising:
   forming a mask on an underlying layer formed on a lower layer;
   etching the underlying layer using the mask as an etching mask to form patterns on the lower layer, the patterns defining at least one opening; and then
   forming a sacrificial layer in the at least one Opening, the sacrificial layer covering the mask and the lower layer below the at least one opening; and then
   etching an upper portion of the sacrificial layer to expose an upper surface of the mask; and then
   removing the mask,
   wherein the sacrificial layer in the opening is partially etched when the mask is removed such that a remaining portion of sacrificial layer is recessed in the at least one opening, and
   wherein removing the mask is continuously performed after the upper portion of the sacrificial layer is etched.

2. The method of claim 1, wherein the sacrificial layer is formed of an organic material.

3. The method of claim 2, wherein the sacrificial layer includes at least one of a silicon layer containing hydrogen and carbon, a silicon layer containing carbon, a photoresist layer, a polymer layer, and a combination thereof.

4. The method of claim 3, further comprising removing the sacrificial layer in the at least one opening after removal of the mask, wherein removing the sacrificial layer is performed using an ashing or strip process.

5. The method of claim 1, wherein the mask contains silicon or nitride.

6. The method of claim 5, wherein the lower layer is protected by the sacrificial layer when the mask is removed.

7. The method of claim 5, wherein the mask is removed using an etch back process.

8. The method of claim 1, wherein etching of the upper portion of the sacrificial layer and removing the mask are performed using the same process condition.

9. The method of claim 1, wherein an lowermost portion of the patterns defining the at least one opening has a width equal to a width of the mask.

10. A method of fabricating a semiconductor device, comprising:
    forming a mask on an insulating layer formed on a substrate;
    etching the insulating layer using the mask as an etching mask to form insulating patterns on the substrate, the insulating patterns defining at least one opening which exposes a portion of the substrate; and then
    forming a sacrificial layer in the at least one opening to cover the mask and the exposed substrate; and then
    etching an upper portion of the sacrificial layer to expose an upper surface of the mask; and then
    removing the mask; and then
    removing the sacrificial layer in the at least one opening; and then
    forming a selection element in the at least one opening; and then
    forming a lower electrode, a variable resistance pattern, and an upper electrode, which are electrically connected to the selection element,
    wherein the sacrificial layer in the at least one opening is partially etched when the mask is removed such that a remaining portion of the sacrificial layer is recessed in the at least one opening, and
    wherein removing the mask is continuously performed after the upper portion of the sacrificial layer is etched.

11. The method of claim 10, wherein the sacrificial layer is formed of an organic material, and
    wherein the organic material includes at least one of a silicon layer containing hydrogen and carbon, a silicon layer containing carbon, a photoresist layer, a polymer layer, and a combination thereof.

12. The method of claim 10, wherein the mask is removed using an etch back process, and
    wherein the substrate is protected by the sacrificial layer when the mask is removed.

13. The method of claim 10, wherein the variable resistance pattern includes a chalcogenide material.

14. The method of claim 13, wherein the variable resistance pattern includes at least at least one of SeSbTe, GeTeAs, SnTeSn, GeTe, SbTe, SeTeSn, GeTeSe, SbSeBi, GeBiTe, GeTeTi, InSe, GaTeSe, InSbTe, and a combination thereof.

15. The method of claim 14, wherein the variable resistance pattern further includes at least one of carbon (C), nitrogen (N), silicon (Si), oxygen (O), and a combination thereof.

16. The method of claim 10, further comprising forming an ohmic layer between the selection element and the lower electrode.

17. The method of claim 10, further comprising forming a word line between the substrate and the selection element.

18. The method of claim 17, further comprising forming a bit line electrically connected to the upper electrode, wherein the bit line extends in a direction substantially different from that of the word line.

* * * * *